United States Patent [19]

Teng-Hong

[11] Patent Number: 4,784,615

[45] Date of Patent: Nov. 15, 1988

[54] DIRECT CONTACT FLEXIBLE CIRCUIT INTERCONNECT SYSTEM AND METHOD

[75] Inventor: Toh Teng-Hong, Penang, Malaysia

[73] Assignee: Motorola, Inc., Schaumburg, Ill.

[21] Appl. No.: 1,291

[22] Filed: Jan. 7, 1987

[51] Int. Cl.[4] ............................................. H01R 13/04
[52] U.S. Cl. ..................................................... 439/496
[58] Field of Search ...................... 439/59, 66, 67, 77, 439/86, 493, 591, 592, 593, 496

[56] References Cited

U.S. PATENT DOCUMENTS

| | | |
|---|---|---|
| 3,624,587 | 11/1971 | Conrad . |
| 3,825,878 | 7/1974 | Finger et al. . |
| 3,951,493 | 4/1976 | Kozel et al. . |
| 4,057,311 | 11/1977 | Evans . |
| 4,162,818 | 7/1979 | Martin . |
| 4,548,451 | 10/1985 | Benarr et al. . |
| 4,552,420 | 11/1985 | Eigenbrode . |

FOREIGN PATENT DOCUMENTS

| | | |
|---|---|---|
| 2381404 | 9/1978 | France . |
| 1317264 | 5/1973 | United Kingdom ................ 439/496 |
| 1364320 | 8/1974 | United Kingdom ................ 439/496 |
| 1571857 | 7/1980 | United Kingdom . |

OTHER PUBLICATIONS

R. Rice and J. J. Shea, "Circuit Board Assembly", IBM Technical Disclosure Bulletin, vol. 4, No. 9, Feb. 1962.

*Primary Examiner*—Joseph H. McGlynn
*Attorney, Agent, or Firm*—Joseph T. Downey; Anthony J. Sarli, Jr.; Donald B. Southard

[57] ABSTRACT

A flexible circuit interconnect system and method for providing direct electrical contact between a flexible circuit and a printed circuit board or an additional flex circuit is disclosed. In one embodiment, elastomeric material is located between the flex circuit and a rigid support to provide an interconnection receptacle for electrical contact with a printed circuit board. In another embodiment, one flex circuit surrounds a formed elastomeric wedge and a second flex circuit is rigidly supported with an opening corresponding to the wedge. Compression of elastomeric material maintains direct contact between the connecting pads of the circuit members.

8 Claims, 4 Drawing Sheets

DIRECT CONTACT FLEXIBLE CIRCUIT INTERCONNECT SYSTEM AND METHOD

BACKGROUND OF THE INVENTION

The present invention relates, in general, to a flexible circuit interconnect system and method. More particularly, the invention relates to a system and method of special utility in providing direct electrical contact between a flexible circuit member and a printed circuit board or another flexible circuit.

There are known in the art numerous techniques for providing electrical contact between a number of printed circuit boards or flexible circuit members. However, these techniques have generally fallen into two categories: either the use of an intermediate electrical contact device between the various boards or circuit members; or the use of excessively complex and unduly bulky clamps applied externally to force intimate contact between circuit boards or other circuit members.

U.S. Pat. No. 3,624,587 issued to Conrad on Nov. 30, 1971 for a Clinched-wire Interconnection Device for a Printed Circuit Board illustrates a technique in which a third or intermediate element must be present as an interface between the two printed circuit boards. The receiving board has loops of resilient conductive wire which engage fingerlike insertion strips of a mating printed circuit board. The technique described requires that both circuits be rigid and is simply not applicable where one of the components is a flexible circuit member.

U.S. Pat. No. 3,825,878 issued to Finger et al. on Sept. 10, 1973 for a Flexible Flat Cable System discloses an interconnection technique for a flexible cable. An external housing traps a flexible cable to provide connection to a printed circuit board and provides test point access to the conductors on the board. A flexible cable does not normally have the capability for mounting electronic components as does a flex circuit and the cable is merely a series of electrical conductors. Thus, the cable would comprise a third element for providing electrical interconnection between various circuit members.

U.S. Pat. No. 3,951,493 issued to Kozel et al. on Aug. 14, 1974 for a Flexible Electrical Connector and Method of Making the Same describes a technique in which an intermediate conductive interface is required for interconnecting two rigid printed circuit boards. Conductive strips are placed upon a core of resilient material to provide a flexible interconnection device. The disadvantage of this technique is the requirement for the connector as an additional or intermediate element along the conducting path. Clearly, the more interfaces which are introduced along an electrical path, the less reliable the conducting path becomes.

Similarly, U.S. Pat. No. 4,057,311 issued to Evans on Nov. 11, 1976 for an Elastomeric Connector for Parallel Circuit Boards also requires the interposition of a third circuit or intermediate element between parallel rigid circuit boards. A flexible circuit having closely spaced conductors surrounds an elastomeric body. Contact is made by an external clamp to hold the interface element in compression and establish electrical contact between the printed circuit boards. For the reasons described above, this technique has inherently undesirable aspects and furthermore requires an additional clamping process to establish the interconnection between circuit boards.

A further prior art technique in which no third element is interposed between circuit members is a pressure pad compression contact in which direct contact is provided between a flexible circuit member and a printed circuit board or another flexible circuit. An external clamp composed of screws and a pressure plate are utilized in conjunction with a compression pad to clamp down upon the contacts of the circuit members. This system is unduly complex and costly in manufacture and unnecessarily complicates the interconnection and disassembly of the circuit member elements.

SUMMARY OF THE INVENTION

It is therefore an object of the present invention to provide an improved flexible circuit direct contact interconnect system and method.

It is further an object of the present invention to provide an improved flexible circuit direct contact interconnect system and method by which is readily and inexpensively achieved.

It is still further an object of the present invention to provide an improved flexible circuit interconnect system and method in which the contacting circuit members may each be mounted with components yet be reliably electrically directly connected together without the use of external clamps.

It is still further an object of the present invention to provide an improved flexible circuit direct contact interconnect system and method which obviates the use of connectors thereby reducing space requirements in effectuating electrical interconnections between miniaturized electronic circuit members.

The foregoing objects ar achieved in the present invention in which, in one embodiment, is provided a system for establishing electrical contact between a flexible first circuit member and a second circuit member, with the circuit members having opposite interconnection and carrier surfaces. The system comprises at least one electrical conductor affixed to each of the interconnection surfaces of the flexible first circuit member and the second circuit member, support means supports the flexible first circuit member and define an interconnection receptacle, and resilient is member positioned between the flexible first circuit member and the supporting means and located adjacent the interconnection receptacle. When the second circuit member is inserted into the interconnection receptacle to directly contact the flexible first circuit member, the resilient member is compressed, thereby insuring reliable intimate direct electrical contact.

In an alternative embodiment in which is provided a system for establishing electrical contact between first and second flexible circuit members, which have opposite interconnection and carrier surfaces comprises at least one electrical conductor affixed to the interconnection surfaces of each the first and the second flexible circuit members, support means support the first flexible circuit member and define an interconnection receptacle, and a formed resilient member overlays by the second flexible circuit member and is shaped for insertion in and retention by the interconnection receptacle. When the second circuit member overlaying the formed resilient member is inserted into the interconnection receptacle to directly contact the first flexible circuit member, the formed resilient member is compressed, thereby insuring reliable intimate direct electrical contact.

BRIEF DESCRIPTION OF THE DRAWINGS

The above-mentioned and other features and objects of the present invention and the manner of attaining them will become more apparent and the invention itself will be best understood by reference to the following description of embodiments of the invention taken in conjunction with the accompanying drawings, wherein.

DESCRIPTION OF A PREFERRED EMBODIMENT

Figure 1:
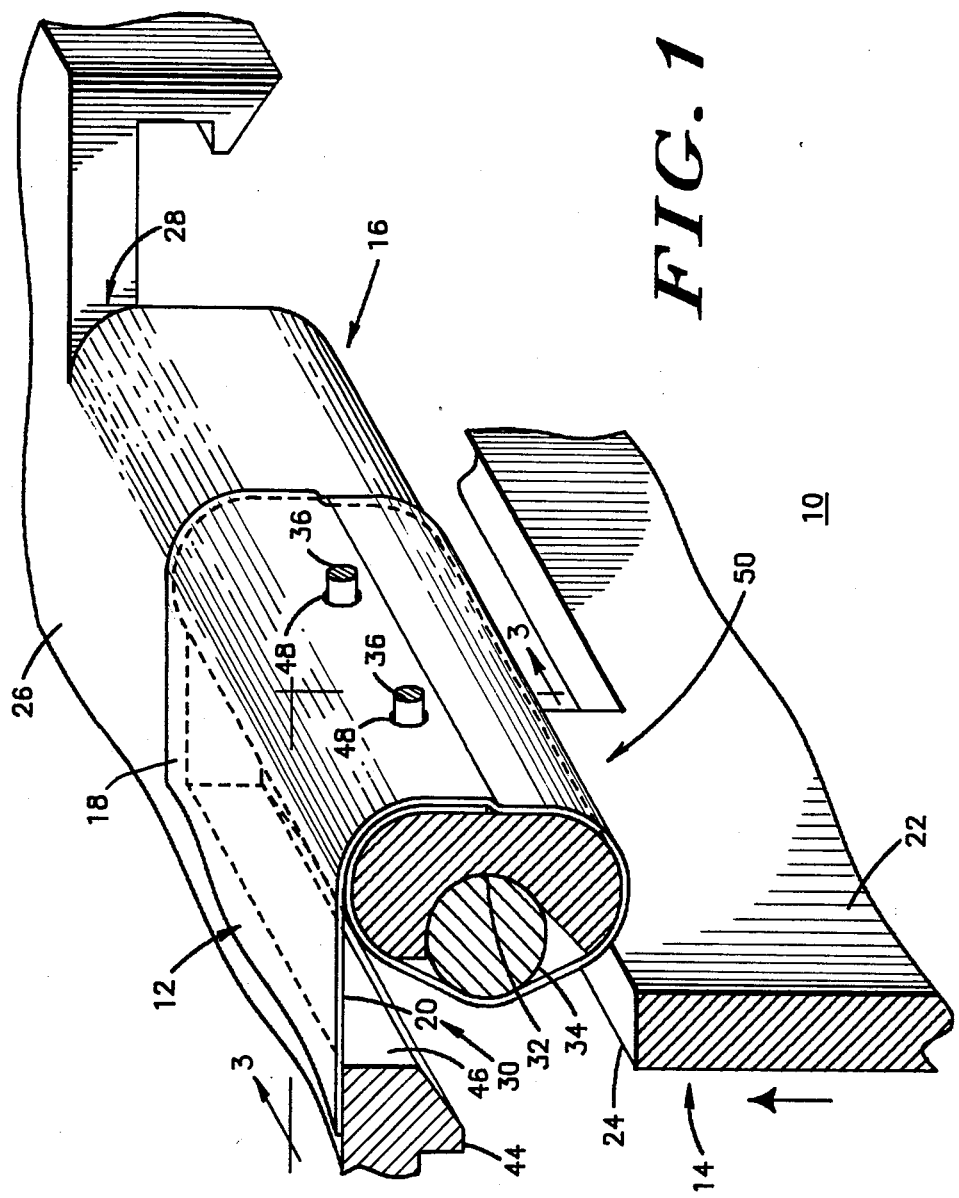
FIG. 1 illustrates a partially cut-away perspective view of an embodiment of the present invention in which a flexible circuit member is held in direct electrical contact with a printed circuit board.

With reference to FIGS. 1, 2, and 3, a flexible circuit interconnect system 10 and the steps to assemble it are shown. In FIG. 1A, flexible circuit interconnect system 10 is shown to comprise a flex circuit 12 which is held by support 16 for direct electrical connection to printed circuit board 14. Flex circuit 12 is shown to be wrapped on spindle 28 of support 16 and further supported on surface 26 of support 16. Support 16, as will be described in greater detail later, provides the rigid support structure for flex circuit 12 so that it can be directly interconnected with a printed circuit board 14. Flex circuit 12 may be any commercially available flexible circuit member having conductive patterns and upon which electronic components may be mounted. Flex circuit 12 may be comprised of a KAPTON (trademark of E.I. DuPont), a polyimide substrate which may have copper or other metallic conductive patterns thereon. Printed circuit board 14 may be any generally rigid, self-supporting circuit board upon which electronic components may be mounted and electrically connected via conductive strips or runners. The direct contact interconnection will occur between surface 18 of the flex circuit and surface 22 of printed circuit board 14.

In FIG. 1, flex circuit 12 includes an interconnect surface 18 and an opposite carrier surface 20. As will be described, interconnect surface 18 includes a number of interconnect pads 42 and connecting pads 40 (FIG. 2A) while carrier surface 20 may also include a number of interconnects (not shown) for providing a circuit pattern. Flex circuit 12 has a portion for wrapping engagment of support 16 at spindle 28 and a plurality of holes 48 to engage pegs 36 protruding from spindle 28.

Incorporated within spindle 28 of support 16 at channel 32 thereof is resilient core 34. Resilient core 34 comprises an elastomer such as silicone rubber which, when compressed, forces flex circuit 12 toward the inserted printed circuit board 14. Support 16 is shown to have a slot 30 which is formed by surface 46 of a wall 44 and the spindle 28. Slot 30, along with spindle 28, provides the interconnection receptacle structure to enable printed circuit board 1 to be brought into direct electrical contact with flex circuit 12.

Figure 2A:
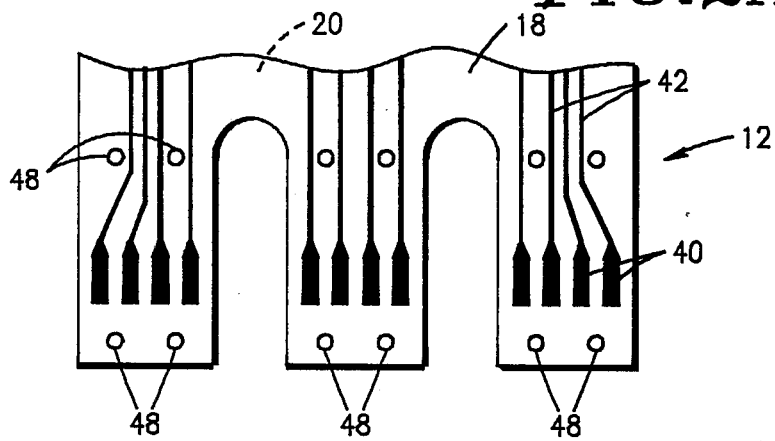
FIGS. 2A-C are plan views of the elements shown of FIG. 1 showing a flex circuit, support, and a printed circuit board.
Figure 2B:
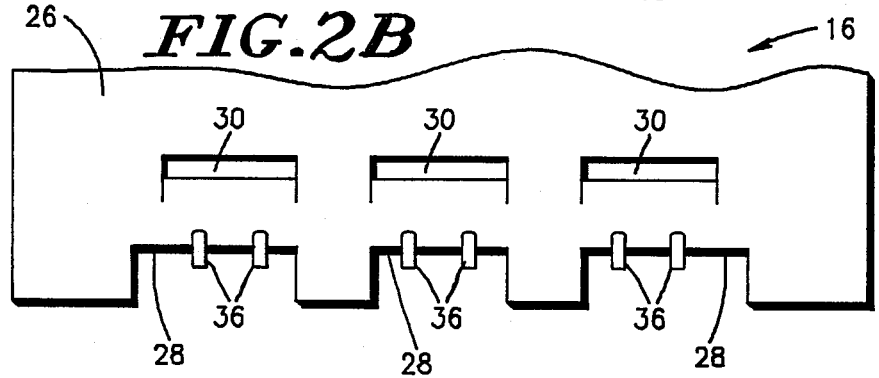
Figure 2C:
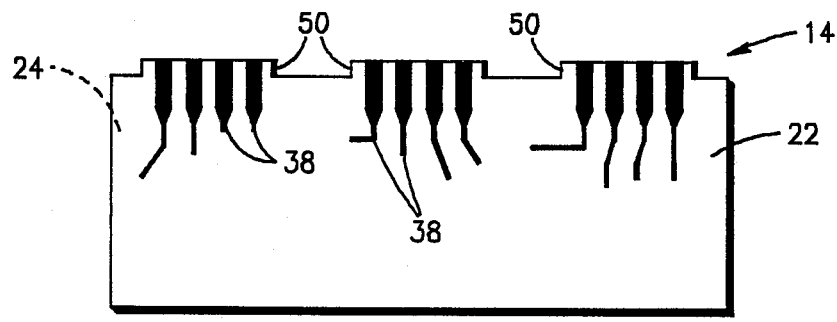

Referring now to FIGS. 2A-C, top or plan views of the various elements shown in FIG. 1 are shown in greater detail. FIG. 2A shows that interconnect surface 18 of flex circuit 12 includes a plurality of interconnection runners 42 extending to interconnection pads 40. In addition, there is a plurality of holes 48 which are adjacent the connecting pads and are designed to engage pegs 36 which protrude from the outer edge of spindle 28. The portion of flex circuit 12 shown shows the characteristic fingerlike extensions which correspond to the portion of the flex circuit which wraps around spindle 28 after passing through slot 30. The latter portion of the flex circuit does not need the fingerlike projections and thus is an entire sheet of flex circuit. FIG. 2B shows a top plan view of support 16 showing the upper support surface 26, the corresponding slots 30 for the fingerlike projections of flex circuit 12, and pegs 36 extending outwardly from spindle 28. FIG. 2C shows printed circuit board 14 to include a number of peripheral connecting pads designated 38 which are mounted o interconnect surface 22 at extension tabs 50. It will be observed that extension tabs 50 correspond in width to slot 30 as do the fingerlike projections of the flex circuit 12.

Figure 3A:
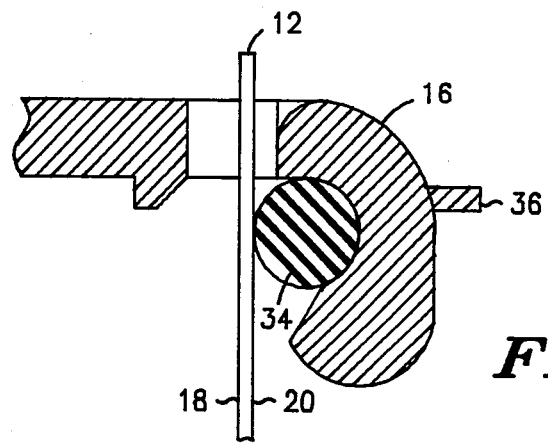
FIGS. 3A-C show in sectioned views the steps of forming the structure for the embodiment shown in FIG. 1.
Figure 3B:
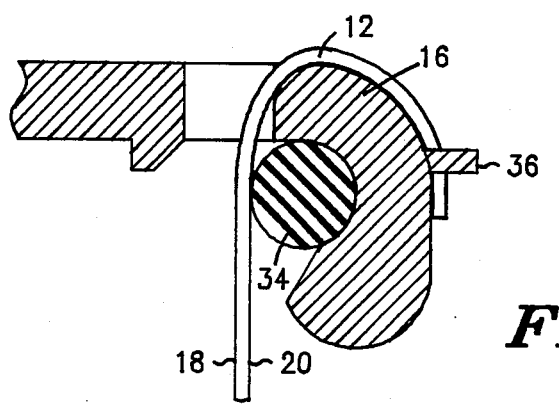
Figure 3C:
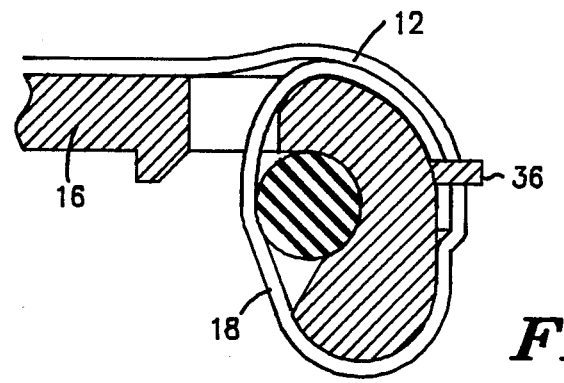

FIGS. 3A-C show the steps in the process of wrapping one of the fingerlike projections of flex circuit 12 onto the spindle portion 28. The steps are shown superimposed on Section 3—3 of FIG. 1. As may be seen in FIG. 3A, the fingerlike extension flex circuit 12 is brought up through slot 30 with the interconnect surface 12 intended to be positioned on the outside relative to spindle 28. In FIG. 3B, it is shown that flex circuit 12 is engaged at peg 36. Peg 36 extends through a hole 48 and the flex circuit is wrapped around resilient core 34 to entrap it in channel 32 of spindle 28. In FIG. 3C, the final wrapping process of the fingerlike projection of flex circuit 12 is shown to have overlapped itself. The overlap wrapping of flex circuit 12 will complete the entrapment of resilient core 34. Peg 36 is shown to extend through the second hole 48 locking the wrap. The remaining material of flex circuit 12 is positioned along the supporting structure 16. Thus, it may be seen that the embodiment shown in FIG. 1 can easily be provided to both entrap the resilient material and support the flex circuit to establish an interconnection receptacle for direct contact with the circuit board 14.

As stated earlier, printed circuit board 14 includes a number of peripheral connecting pads 38 (FIG. 2) affixed to tab 50 portion. By insertion of printed circuit board 14 in the direction shown in FIG. 1 within slot 30 of support 16, connecting pads 40 fo flex circuit 12 (FIG. 2) are wedged toward and abut connecting pads 38 of printed circuit board 14. In this manner, interconnect face 22 of printed circuit board 14 adjoins interconnect surface 18 of flex circuit 12. In like manner, carrier face 24 of printed circuit board 14 adjoins fixed surface 46 of wall 44 formed as part of support 16. It should be noted that carrier face 24 may also include a number of conductive runners (not shown) forming a circuit pattern. Wall 44 of support 16 presents a beveled edge to aid insertion of tab 50 of printed circuit board 14 within slot 30. The interconnection receptacle is formed by wall 46 of slot 30 and flex circuit 12 wrapped around spindle 28 and entrapping resilient core 34. Upon insertion, the resulting compression of resilient core 34 provides a contact force to carrier surface 20 of flex circuit 12 by the wedging insertion of printed circuit board 14 thereby abutting connecting pads 40 and 38 insuring direct, electrical contact therebetween.

Figure 4:
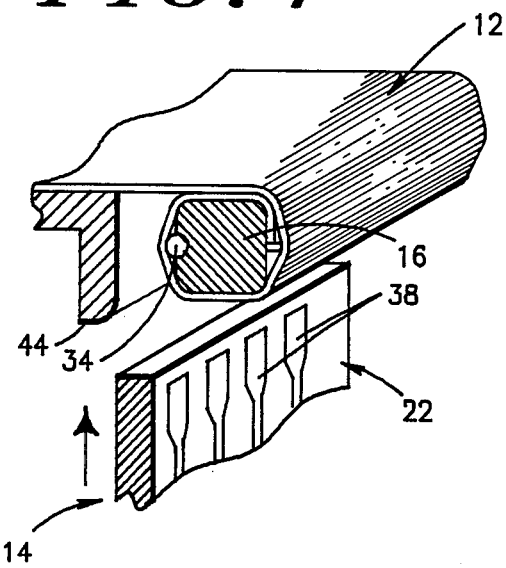
FIG. 4 is an illustration of the embodiment of FIG. 1 in which the support member 16 has a different cross sectional shape and showing additional details of the printed circuit board.

FIG. 4 shows an alternative embodiment for the apparatus shown in FIG. 1 in which the support 16 has a somewhat different spindle cross section and the finger-like projection of flex circuit 12 has only a single pair of holes 48 to anchor on pins 36 so that there is a complete or contiguous wrap of the flex circuit around the right hand portion of support spindle 28 as shown. In this embodiment, only a single hole is used to attach flex circuit 12 and no projection of peg 36 extends through the outside wrap flex circuit 12. It will be appreciated that any number of such attachment schemes may be used to attach the flex circuit to the spindle without deviating from the spirit of the present invention. In addition, printed circuit board 14 is shown to have interconnection pads 38 on the interconnection surface 22 thereof and the board is aligned with direction arrow indicating that it is to be inserted in the interconnection receptacle formed by the equivalent of slot 30 to then make direct contact between the printed circuit board pads as shown and the interconnect surface 18 of flexible circuit 12.

Figure 5:
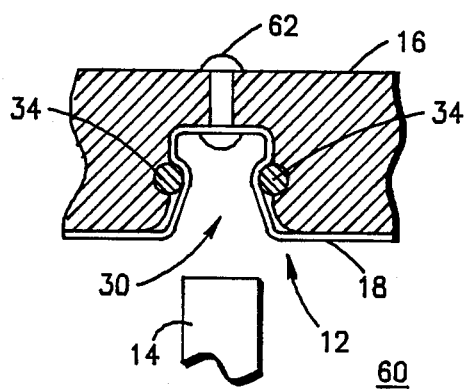
FIG. 5 illustrates an alternative embodiment of the present invention for providing direct electrical contact between a flex circuit and one or both sides of a printed circuit board.

Referring to FIG. 5, an alternative embodiment 60 of a flexible circuit interconnect system is shown in which insertion of printed circuit board 14 provides a wedging force to compress a pair of oppositively positioned resilient cores 34 which operate provide the direct contact force. In this embodiment, like structures of the above described flexible circuit interconnect system 10 are similarly numbered and the foregoing description is appropriate here. In alternative embodiment 60, flex circuit 12 is secured to a slot 30 within a support 16 by means of rivet 62 or other suitable securing means rather than by attachment to a peg 36. A pair of opposed resilient cores 34 insure contact between flex circuit 12 and printed circuit board 14. By use of this embodiment, it is possible to pattern connecting pads 40 on flex circuit 12 so as to make direct electrical contact with connecting pads 38 on one or both sides of printed circuit board 14. Flex circuit 12 may also include a circuit pattern on both sides although having connecting pads 40 on only interconnect surface 18.

Figure 6:
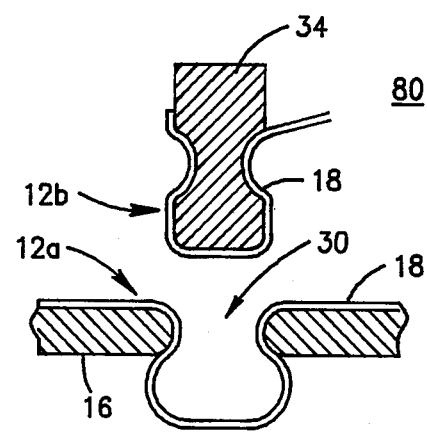
FIG. 6 illustrates an additional alternative embodiment of the present invention for providing direct electrical contact between a pair of flex circuits.

Referring now to FIG. 6, an alternative embodiment 80 of the flexible circuit interconnect system and method of the present invention is shown utilizing a preformed resilient core 34 to provide both wedging and direct contact force. Alternative embodiment 80 is useful in providing a simple, direct electrical contact between a pair of flex circuits 12. A first flex circuit 12a overlies a rigid support 16 and extends into slot 30 substantially as shown, thus forming an interconnection receptacle. A second flex circuit 12b surrounds a resilient core 34 which is shaped for insertion and retention within slot 30 such that direct electrical connection may be readily and inexpensively established between flex circuits 12a and 12b. Both first and second flex circuits 12a and 12b may have a number of interconnects defining a circuit pattern on one or both sides thereof although each has only connecting pads on interconnect surface 18 adjacent slot 30.

It should be noted that in alternative embodiment 80, the contact force is provided by the resilient core itself and does not require the use of external clamps for compression. The wedging force provided by insertion of the flex circuit covered resilient core itself into an interconnection receptacle formed within a supporting member is sufficient to compress the resilient core and provide the direct contact force for electrical contact. For embodiment 80, both circuit members comprise flex circuits to enable each to conform to the contours of the other circuit member. For this reason, the resilient core should adjoin the flexible circuit member at its carrier surface and opposing the connecting pads to provide a constant contact force. The connecting pads, as have been described, are those portions of the electrical interconnects which comprise a conductor electrically exposed on the interconnect surface of the circuit member. The wedging action, in contrast to a clamping action, is used to adjoin the two circuit members at their interconnect surfaces and the compression of the resilient core by the rigid support for the second flex circuit insures continued intimate direct contact between the two flex circuits.

What has been provided, therefore, is an improved flexible circuit interconnect system and method by direct contact which is readily and inexpensively achieved and in which the contacting circuit members may be directly mounted with components yet be reliably electrically connected together without the us of external clamps. The flexible circuit interconnect system and method of the present invention eliminates the use of special connectors or other intermediate electrical contacts thereby reducing space requirements and providing electrical interconnection between miniaturized electronic circuits. The system and method of the present invention precludes the necessity of introducing intervening contact elements thereby limiting the number of failure prone elements in an interconnect system.

While there have been described above the principles of the invention in conjunction with specific apparatus, it is to be clearly understood that this description is made only by way of example are not as a limitation to the scope of the invention.

What is claimed is:

1. A system for establishing electrical contact between first and second flexible circuit members, said circuit members having opposite interconnection and carrier surfaces comprising:

at least one electrical conductor affixed to the interconnection surfaces of each said first and second flexible circuit members;

a rigid support for supporting said first flexible circuit member, said support having a slot into which said first flexible circuit member extends for defining an interconnection receptacle; and a preformed resilient member overlaid by said second flexible circuit member, said resilient member having a substantially rectangular cross section body wider than the width of said slot, said body further having a necked portion corresponding substantially to the width and thickness of said slot;

whereby when said second circuit member overlaying said preformed resilient member is inserted into said interconnection receptacle to directly contact said first flexible circuit member, said necked portion engaging said slot compresses said preformed resilient member, retaining said resilient member in said interconnection receptacle and providing an electrical contact.

2. The system of claim 1 wherein said necked portion has a substantially circular cross-section.

3. The system of claim 1 wherein said first and second flexible circuit members comprise polyimide substrates.

4. The system of claim 3 wherein said first flexible circuit member includes at least one electrical conductor affixed to said carrier surface thereof.

5. The system of claim 3 wherein said second flexible circuit member includes at least one electrical conductor affixed to said carrier surface thereof.

6. The system of claim 3 wherein said formed resilient member is an elastomer.

7. The system of claim 6 wherein said elastomer is silicone rubber.

8. A method for establishing direct electrical contact between flexible circuit members comprising the steps of:

(a) providing first and second flexible circuit members each having opposite interconnection and carrier surfaces, each interconnection surface including at least one electrical conductor;

(b) supporting the first flexible circuit member in a slot formed in a rigid support member in contact with the carrier surface thereof to form an interconnection receptacle;

(c) providing a preformed resilient member having a substantially rectangular cross section body wider than the slot, the body having a necked portion substantially corresponding to the width and thickness of the slot;

(d) overlaying the preformed resilient member by the second flexible circuit member;

(e) adjoining the interconnection surface of the second flexible circuit member with the interconnection surface of the first flexible circuit member at the interconnection receptacle; and (f) engaging the electrical conductors of the first and second circuit members by insertion of the preformed resilient member overlaid by the second flexible circuit member into the interconnection receptacle to engage the necked portion in the slot, thereby compressing and retaining the resilient member.

* * * * *